United States Patent [19]

Asano

[11] Patent Number: 4,694,320

[45] Date of Patent: Sep. 15, 1987

[54] SEMICONDUCTOR INTEGRATED CIRCUIT HAVING MULTIPLE-LAYERED CONNECTION

[75] Inventor: Tetsuro Asano, Gunma, Japan

[73] Assignee: Sanyo Electric Co., Japan

[21] Appl. No.: 894,381

[22] Filed: Aug. 7, 1986

Related U.S. Application Data

[63] Continuation of Ser. No. 714,719, Mar. 21, 1985.

[30] Foreign Application Priority Data

| Mar. 29, 1984 | [JP] | Japan | 59-62494 |
| Mar. 29, 1984 | [JP] | Japan | 59-62495 |
| Mar. 29, 1984 | [JP] | Japan | 59-62496 |

[51] Int. Cl.⁴ .............. H01L 27/02; H01L 23/48; H01L 29/44; H01L 29/52
[52] U.S. Cl. ........................ 357/40; 357/68; 357/51; 357/55; 307/467
[58] Field of Search ............ 357/40, 68, 51, 55; 307/467

[56] References Cited

U.S. PATENT DOCUMENTS

| 4,499,484 | 2/1985 | Tanizawa et al. | 357/40 |
| 4,500,906 | 2/1985 | Ohno et al. | 357/68 |

FOREIGN PATENT DOCUMENTS 0020116 12/1980 European Pat. Off. .............. 357/40

Primary Examiner—Martin H. Edlow
Assistant Examiner—Robert P. Limanek
Attorney, Agent, or Firm—Darby & Darby

[57] ABSTRACT

A semiconductor integrated circuit having a multiple-layered connection comprises a semiconductor substrate (11), having circuit elements (Tr1, Tr2, Tr3, R1, R2, R3, R4) formed in a first region (16) of the surface of the substrate (11). A first insulating layer (12) is formed to cover the surface of the substrate (11) and, a first electrode layer (13) is formed on the first insulating film (12) to include a first portion of connection runs (13') extending in parallel in the first region (16) for connection to the circuit elements and a second portion of connection runs (13") in a second region (17). A second insulating layer (14) is then formed to cover the first insulating layer (12) and the first electrode layer (13), and a second electrode layer (15) is formed on the second insulating layer to include connection runs (18) extending in parallel and intersecting the connection runs of the first electrode layer (13) at the right angle between first and second regions (16 and 17) for connection to the connection runs (3') of the first portion and to the connection runs (13") of the second portion of the first electrode layer (13).

14 Claims, 8 Drawing Figures

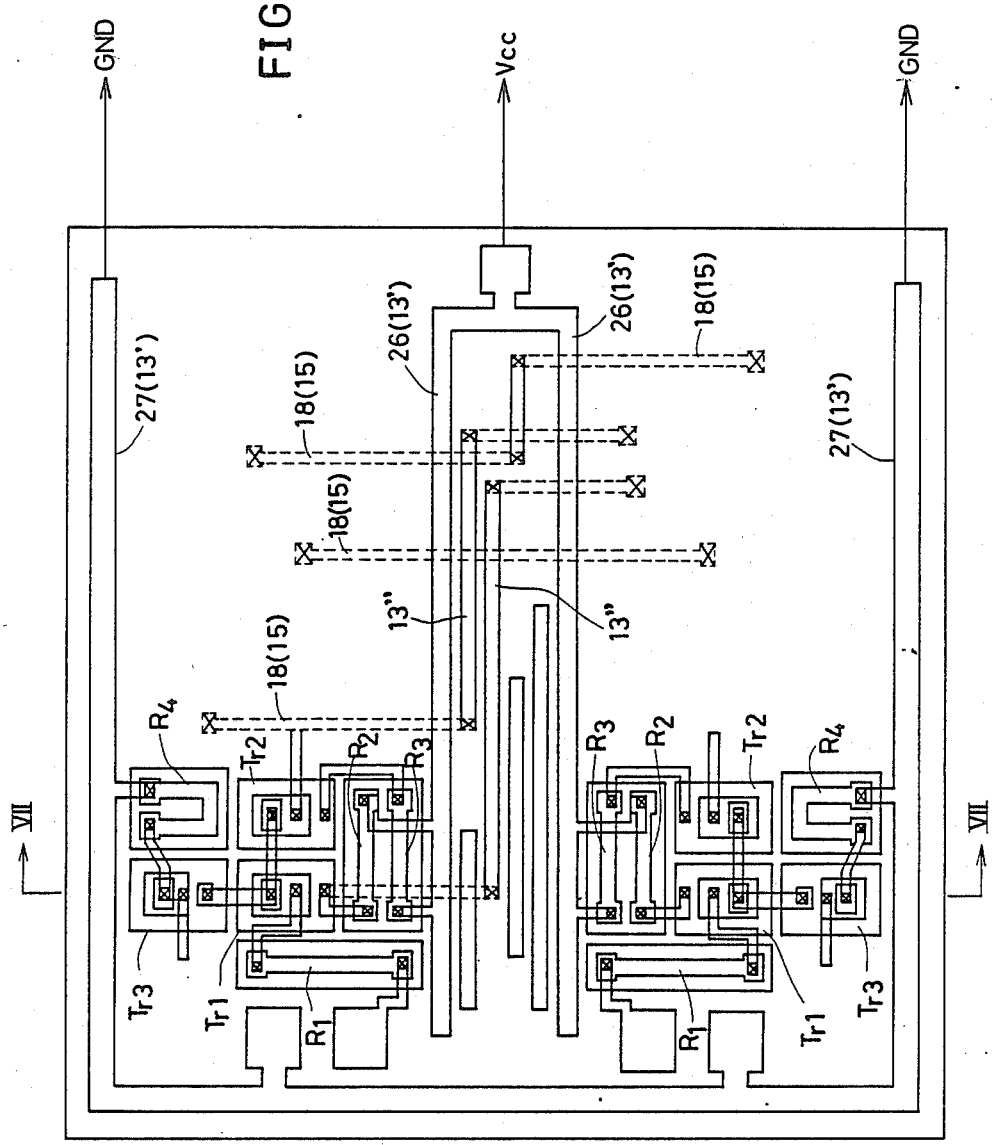

SEMICONDUCTOR INTEGRATED CIRCUIT HAVING MULTIPLE-LAYERED CONNECTION

This is a continuation of U.S. patent application Ser. No. 06/714,719, filed Mar. 21, 1985.

BACKGROUND OF THE INVENTION

1. Field of the Invention

The present invention relates to a semiconductor integrated circuit and, more specifically, to a semiconductor integrated circuit having a multiple-layered connection.

2. Description of the Prior Art

A structure of a multiple-layered connection has been recently employed in a certain type of a semiconductor integrated circuit to enhance the degree of integration of circuit elements by providing facility of connection. An example of such integrated circuit employing a multiple-layered connection is disclosed in Japanese Patent Publication Gazette No. 51-44871, wherein polyimide is employed as an interlayer insulating film.

FIG. 1 is a partial plan view of a conventional integrated circuit having a circuit pattern of a conventional two-channel amplifier circuit. It is pointed out that FIG. 1 shows in a simplified manner only an arrangement of connection runs of multiple electrode layers to be multiple-layered, while any other portions such as circuit elements of the integrated circuit are omitted in illustration for facility of understanding of the arrangement of the connection runs of the electrode layers to be multiple-layered. Referring to FIG. 1, a connection run 6 as a voltage source line for the voltage $V_{cc}$ is disposed in the central portion of a substrate 1 to extend in the horizontal direction, as viewed in FIG. 1, while a connection run 7 as a ground line for connection to the ground GND is disposed along the periphery of the three sides of the substrate 1. Although illustration was omitted, as well known, circuit elements such as transistors, resistors, diodes and the like, forming amplifier circuits of first and second channels, respectively, are formed in areas on the upper and lower sides, as viewed, of the voltage source line 6 of the semiconductor substrate 1. On the other hand, for the purpose of providing connections between the circuit elements in the upper and lower region, such as connections between the terminals A and A', the terminals B and B', the terminals C and C' and the like, connection runs 8 for mutual connection are formed. It is pointed out that the square terminals at both ends of these connection runs 8 are contacts for connection to the circuit elements concerned, although these circuit elements are not shown in FIG. 1.

As to be described subsequently in more detail, a first insulating film is formed on the main surface of the substrate 1 having the circuit elements formed thereon, the above described connection runs 6 and 7 and other connection runs for connection to the circuit elements are formed as a first electrode layer on the first insulating film in a predetermined pattern. A second insulating layer is then formed on the first insulating film and the first electrode layer and the connection runs 8 are then formed as a second electrode layer on the second insulating layer in a predetermined pattern for connection to the connection runs of the first electrode layer.

From the illustration in FIG. 1, it would be readily appreciated that a multiple-layered connection structure is required at the intersections between the connection run for the terminals D and D' and the connection run for the terminals E and E' and the intersection between the connection run for the terminals B and B' and the connection run for the terminals C and C'. To that end, a portion of the connection run 8 for the terminals E and E' is partially formed to be tunneled at an area 9 beneath the connection run 8 for the terminals D and D' and similarly a portion of the connection run 8 for the terminals C and C' is partially formed to be tunneled at an area 9 beneath the connection run 8 for the terminals B and B' to implement a multiple-layered connection structure. For the purpose of such tunneling connection to implement a multiple-layered connection structure at the areas 9, a portion of the first electrode layer is utilized, as to be described in more detail subsequently.

An example of such a multiple-layered connection structure is shown in FIG. 2, which is a sectional view of the integrated circuit shown in FIG. 1 taken along the line II—II in FIG. 1. Referring to FIG. 2, the multiple-layered connection structure will be described. It is pointed out that again for facility of illustration and understanding the circuit elements formed on the surface of the substate 1 are not shown in FIG. 2. The semiconductor substrate 1 having the circuit elements formed is covered with the first insulating layer 2 of silicon dioxide formed on the substate 1 and the first electrode layer 3 is formed in a predetermined pattern of the connection runs 9 as well as the connection runs 6 and 7 on the first insulating layer 2 by an evaporation process of aluminum, for example, such that any necessary connection runs 6 and 7 of the first electrode layer 3 maybe in contact with the circuit elements, not shown, through openings, not shown, formed in the first insulating layer 2. Then the second insulating layer 4 for interlayer insulation is provided on the first insulating layer 2 and the first electrode layer 3 and the second electrode layer 5 is formed thereon in a predetermined pattern of the connection runs 8 by an evaporation process of aluminum, for example.

Particularly in case of a semiconductor integrated circuit including a two-channel amplifier circuit, a power, increase is attempted in most cases through a balanced transformerless connection and a detection signal from the other channel is required in most cases, such as in case of a heat protecting circuit, an overvoltage protecting circuit, an area-of-safe-operation protecting circuit and the like. Accordingly, it could happen that an insulated cross arrangement is required between some two connection runs 8 of the second electrode layer 5. To that end, a portion of the first electrode layer 3 is utilized to form a lower layer of such insulated cross arrangement of two connection runs 8 of the second electrode layer 5. A structure of such insulated cross arrangement is implemented such that, as shown in FIG. 2, one connection run 8' of the second electrode layer 5 is tunneled by a portion 9 of the first electrode layer 3, while the other connection run 8'' of the second electrode layer 5 is insulated by the second insulating layer 4.

However, in case of such a multiple-layered connection structure, a fundamental designing rule is adapted such that basically the connection runs of the first electrode layer 3 are utilized as much as possible to provide connection to the respective circuit elements so that the connections are made on substantially the whole surface, while those portions whose connection is not achieved by the connection runs of the first electrode layer 3 are connected through the connection runs of the second electrode layer 5. Accordingly, in providing an insulated cross arrangement of the connection runs of the second electrode layer 5, it is necessary to secure in advance an area; for tunneling by the use of a portion of the first electrode layer 3 as a lower layer, as shown in FIG. 2, which makes the designing complicated and could cause a case where the chip area need be made large for an area for tunneling.

SUMMARY OF THE INVENTION

Accordingly, a principal object of the present invention is to provide a semiconductor integrated circuit having a multiple-layered connection of a better designing efficiency.

Briefly described, the present invention comprises a semiconductor integrated circuit having a multiple-layered connection, which comprises: a semiconductor substrate having integrated circuit elements formed in a first region having a portion and the remaining portion of the surface, a first insulating layer formed to cover the surface of the substrate, a first electrode layer formed on the first insulating layer and including a first portion of connection runs extending in the first region and being connected through the first insulating layer to the integrated circuit elements and a second portion of connection runs extending in a second region formed between the portion and the remaining portion of the first region of the surface of the substrate, a second insulating layer formed to cover the first insulating layer and the first electrode layer, and a second electrode layer formed on the second insulating layer and including connection runs extending between the first and second regions of the surface of the substrate and being connected through the second insulating layer to the connection runs of the first portion of the first electrode layer in the portion and the remaining portion of the first region and being connected through the second insulating layer to the connection runs of the second portion of the first electrode layer in the second region, whereby the connection runs of the second electrode layer in the portion and the remaining portion of the first region are connected via connection runs of the second portion of the first electrode layer.

In a preferred embodiment of the present invention, the connection runs of the second electrode layer are adapted to extend to intersect the connection runs of the second portion of the first electrode layer at the right angle.

In another preferred embodiment of the present invention, at least one of the connection runs of the second electrode layer is adapted to be bent at an intersecting point where the connection run intersects a predetermined connection run of the second portion of the first electrode layer to extend along the predetermined connection run of the second portion of the first electrode layer to a location spaced apart from the intersecting point and is connected through the second insulating layer to the predetermined connection run of the second portion of the first electrode layer, whereby the above described location where the above described connection run of the second electrode layer is connected through the second insulating layer to the predetermined connection run of the second portion of the first electrode layer is dislocated from another location of such connection between a different connection run of the second electrode layer and a different connection run of the second portion of the first electrode layer, whereby conflict in terms of area among such connections is eliminated.

According to the present invention, since the area for an insulated cross arrangement of the connection runs of the second electrode layer is secured in the second region of the surface of the substrate to allow extension of the second portion of the connection runs of the first electrode layer, the first region of the surface of the substrate may be used for connection of the first portion of the connection runs of the first electrode layer to the integrated circuit elements. As a result, the circuit designing can be done without any concern about the area for an insulated cross arrangement. More specifically, since it is sufficient to secure only the minimum area for the second region, the designing of the connection runs of the first electrode layer and the second electrode layer can be speeded up. In addition, since such insulated cross arrangement is positively made in the second region, always a two-layered connection can be done at a shortest distance.

Furthermore, since the second portion of the connection runs of the first electrode layer is formed in the second region, the integrated circuit elements can be formed only in the first region and as a result the designing of the circuit elements is facilitated. In addition, since the first portion of the connection runs of the first electrode layer is formed to be connected through the first insulating layer to the integrated circuit elements, the circuit can be designed using a connection method similar to an ordinary single-layered connection. An arrangement of the connection runs of the second electrode layer and the connection runs of the second portion of the first electrode layer to intersect at the right angle in a preferred embodiment of the present invention simplifies the designing of both electrode layers, thereby to speed up the designing thereof, and also enhances the density of incorporation of both electrode layers, thereby to reduce the chip area.

Also an arrangement of a connection run of the second electrode layer in a further preferred embodiment to be bent at an intersecting point to extend along a connection run of the second portion of the first electrode layer to a location spaced apart from the intersecting point so that a through-hole may be formed there further facilitates the designing and reduce the area of the second region and hence enhances the density of incorporation of the circuit elements.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a plan view showing in more detail an arrangement of the connection runs of the first and second electrode layers and the circuit elements;

DESCRIPTION OF THE PREFERRED EMBODIMENTS

Figure 1:
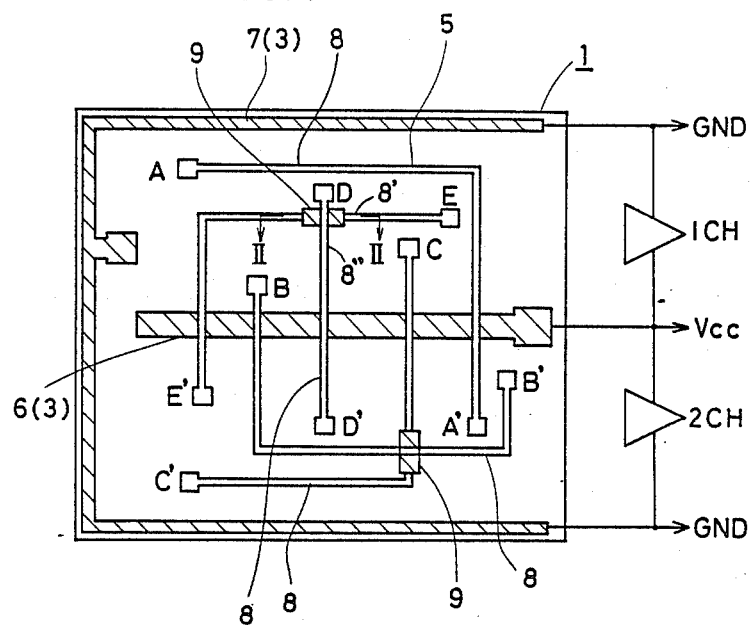
FIG. 1 is a plan view showing in a simplified manner a semiconductor integrated circuit having a conventional multiple-layered connection.
Figure 2:
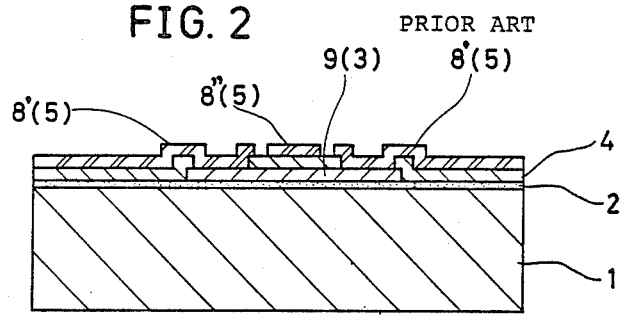
FIG. 2 is a sectional view of the integrated circuit shown in FIG. 1 taken along the line II—II in FIG. 1.
Figure 3:
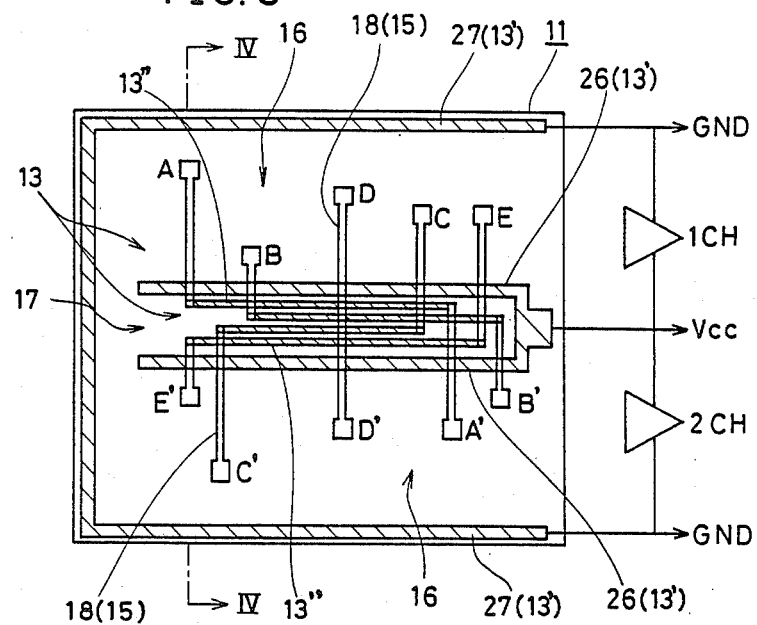
FIG. 3 is a plan view showing in a simplified manner a semiconductor integrated circuit having a multiple-layered connection in accordance with the present invention.
Figure 4:
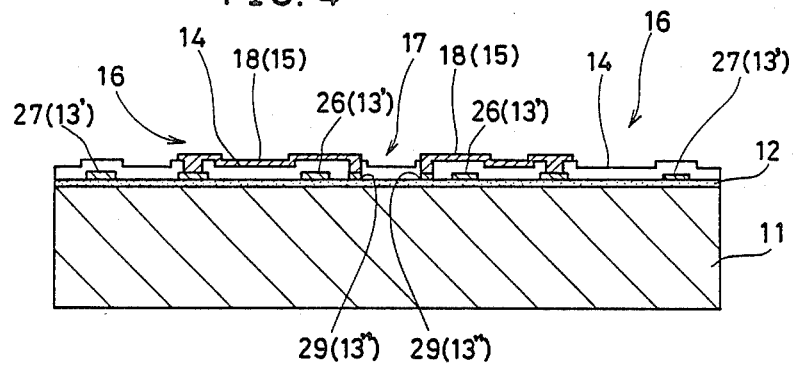
FIG. 4 is a sectional view of the integrated circuit shown in FIG. 3 taken along the line IV—IV in FIG. 3.

One embodiment of a semiconductor integrated circuit having a multiple-layered connection in accordance with the present invention will be described with reference to FIGS. 3 and 4. FIG. 3 shows a plan view of a semiconductor integrated circuit having a multiple-layered connection in accordance with the present invention and FIG. 4 is a sectional view of the integrated circuit shown in FIG. 3 taken along the line IV—IV in FIG. 3. It is pointed out that FIGS. 3 and 4 illustrate mainly an arrangement of the integrated circuit pattern of connection, particularly connection runs of the first and second electrode layers, while any circuit elements are not shown for facility of illustration and understanding of the present invention, for substantially the same reason as described in conjunction with FIGS. 1 and 2.

A plurality of island regions are formed on a main surface of a semiconductor substrate 11 and circuit elements such as transistors, resistors, diodes and the like are formed on the surface in a well-known integrated manner, although these are not shown in FIGS. 3 and 4. An example of an arrangement of such circuit elements will be described subsequently with reference to FIGS. 6, 7 and 8, after the essential feature of the present invention is described with reference to FIGS. 3 and 4. For the moment, however, it is pointed out that the embodiment shown in FIGS. 3 and 4 incorporates those circuit elements necessary for forming a two-channel amplifier circuit.

A first insulating layer 12 of silicon dioxide is formed on the main surface of the substrate 11 having the above described circuit elements formed on the surface and a first electrode layer 13 including connection runs is further formed on the first insulating layer 12. The manner of provision of the first electrode layer 13 is a characteristic feature of the present invention. More specifically, the connection runs of the first electrode layer 13 of the present invention are formed of two portions, a first portion of the connection runs 13' of the first electrode layer extending in a first region 16 of the main surface of the semiconductor substrate 11 and, a second portion of the connection runs 13" of the first electrode layer extending in a second region 17 of the main surface of the semiconductor substrate. To that end, the main surface of the semiconductor substrate 11 is sectioned into the first and second regions 16 and 17. In accordance with the present invention, the integrated circuit elements, not shown in FIGS. 3 and 4, are formed in the first region 16 of the semiconductor substrate 11. At least a portion of the connection runs 13' of the first portion of the first electrode layer 13 are connected through the first insulating layer 12 to the integrated circuit elements, while the connection runs 13" of the second portion of the first electrode layer in the second region 17 are used to provide an insulated cross arrangement cross connection of the connection runs 18 of the second electrode layer 15.

More specifically, the connection runs 26 out of the connection runs 13' of the first electrode layer 13 are disposed as voltage source lines for the voltage $V_{cc}$ to be bifurcate to extend in the horizontal direction, as viewed, in FIG. 3, at the central portion of the substrate 11, so that the voltage source lines of the respective channels may be formed in parallel at the central portion. A connection run 27 out of the connection runs 13' of the first electrode layer 13 is disposed as a ground line for the ground GND to extend along the periphery of the three sides of the substrate 11. In accordance with the embodiment shown, the first region 16 is formed at two areas, each defined as an area surrounded by the connection run 27 for the voltage source line and the connection run 26 for the ground line, so that any necessary connection of the circuit elements of the amplifier circuit of each channel is provided. The second region 17 is formed as an area surrounded by the connection runs 26 for the voltage source lines. The two first regions 16 having a major area of the substrate 11 are used for connection of the connection runs 26, 27 of the first portion of the first electrode layer to the circuit elements for formation of the respective channel amplifier circuit, while the second region 17 may be of a minimum area necessary for providing an insulated cross arrangement of the connection runs 18 of the second electrode layer 15. More specifically, the second region 17 is used for formation of a plurality of connection runs 13" of the second portion of the first electrode layer 13 necessary for an insulating cross arrangement extending in the horizontal direction in a manner similar to that of the connection runs 26 (13') for the voltage source lines.

In accordance with the embodiment of the present invention, the circuit elements to be incorporated in the semiconductor substrate 11 are formed in the first region 16 of the substrate 11 and no circuit elements are formed in the second region 17, inasmuch as the second region 17 is allotted to an insulated cross arrangement of the connection runs 18 of the second electrode layer 15 and should not be preferably used for connection to the circuit elements. In a preferred embodiment of the present invention, a plurality of connection runs 13" necessary for an insulated cross arrangement are provided in parallel at predetermined spacings to extend in the horizontal direction in the second region 17 of the surface of the substrate 11.

A second insulating layer 14 is then formed to cover the first insulating layer 12 and the first electrode layer 13 (13' and 13") and then a second electrode layer 15 is formed on the second insulating layer 14 so as to include connection run 18 extending between the first and second regions 16 and 17 of the main surface of the semiconductor substrate 11. In a preferred embodiment of the present invention, the second insulating layer 14 is made of polyimide or the like. At least a portion of the connection runs 18 of the second electrode layer 15 is connected through openings of the second insulating layer 14 to the connection runs 13' of the first portion of the first electrode layer 13 in the first region 16 and is also connected through through-holes of the second insulating layer 14 to the connection runs 13" of the second portion of the first electrode layer 13 in the second region 17 of the main surface of the semiconductor substate. When a two-channel amplifier circuit is implemented by using a balanced transformerless connection, a heat protecting circuit, an overvoltage detecting circuit, an area-of-safe-operation protecting circuit and the like receiving a detection signal from other channel are required. Accordingly, as shown in FIG. 3, such connections as connection paths A→A', B→B', C→C', D→D', E→E' and the like extending between the channels are required. To that end, the connection path A→A' is implemented such that the connection run 18 of the second insulating layer 15 extending from the terminal A is first made to be in contact with the connection run, 13' of the first portion of the first electrode 13 through a through-hole at the terminal A and the above described connection run 18 of the second electrode layer 15 is then made to extend in the vertical direction as viewed in FIG. 3, intersecting the connection run 26 (13') for the voltage source line at right angles, to extend above the connection run 13" of second portion of the first electrode layer 13, where the same is made to be in contact through a through-hole with the connection run 13" of the second portion of the first electrode,layer 13 in the second region 17 extending in the rightward direction, and connection is further made though a through-hole of the second insulating layer 14 at the point where the same intersects another connection run 18 of the second electrode layer 15 extending in the vertical direction from the terminal A', where the connection run 18 is made in contact though a through-hole of the second insulating layer 14 with the connection run 13']of the first electrode layer 13. Similar connections are made for the connection paths B—B', C—C' and E—E'. Meanwhile, the connection path D—D' is adapted to provide direct connection without providing an insulated cross arrangement inasmuch as the same lies on the line only in the vertical direction.

One of the features of the above described embodiment of the present invention is that since the connection runs 18 of the second electrode layer 15 may be adapted to extend to intersect at the right angle the connection runs 13" of the second portion of the electrode layer 13 in the second region 17 for use in an insulated cross arrangement, the connection runs 18 of the second electrode layer 15 may extend substantially in parallel only in one direction with a shortest distance and, therefore, the designing of the connection runs 18 of the second electrode layer 15 is facilitated.

Another feature of the above described embodiment of the present invention is that since the connection runs 13" of the second portion of the first electrode layer 13 in the second region 17 for use in an insulated cross arrangement are adapted to extend in parallel while the connection runs 18 of the second electrode layer 15 are also adapted to extend in parallel, while both are made to intersect each other at the right angle, any fear is eliminated that the connection runs 18 of the second electrode layer 15 necessitate an insulated cross arrangement outside the second region 17 of the surface of the substrate 11.

In addition, since it is sufficient to provide connection through through-holes at the point where the connection runs 18 of the second electrode layer 15 and the connection runs 13" of the second portion of the first electrode layer 13 in the second region 17 intersect each other, it is sufficient to make the connection runs 13" of the second portion of the first electrode layer 13 in the second region 17 extend in the form of a number of parallel lines necessary for a cross arrangement, which again facilitates the designing of the connection runs 13"of the second portion of the first electrode layer 13 in the second region 17.

Referring again to FIG. 4 showing a sectional view of the integrated circuit taken along the line IV—IV in FIG. 3, the reference numeral 11 denotes the semiconductor substrate, the reference numeral 12 denotes the first insulating layer, the reference numeral 13 denotes the first electrode layer, the reference numeral 14 denotes the second insulating layer, and the reference numeral 15 denotes the second electrode layer. As is clear from FIG. 4, the second insulating film 14 comes to have a step caused by the connection runs 13', 13" of the first electrode layer 13. The offset of the second insulating film 14 involves much possibility that in photoetching the second electrode layer 15 the off set portion is also exposed to light so that the second electrode layer 15 is left as a bridge. In particular, in case where the connection runs 13' of the first electrode layer 13 and the connection runs 18 of the second electrode layer 15 are adapted to extend in parallel, short circuiting is liable to occur due to such bridge. In accordance with the present invention, however, since the connection runs 18 of the second electrode layer 15 and the connection runs 13' of the first electrode layer 13 for providing a cross arrangement are disposed to intersect each other at the right angle, such bridge never occurs and the density of provision of the cross arrangement is enhanced.

Figure 5:
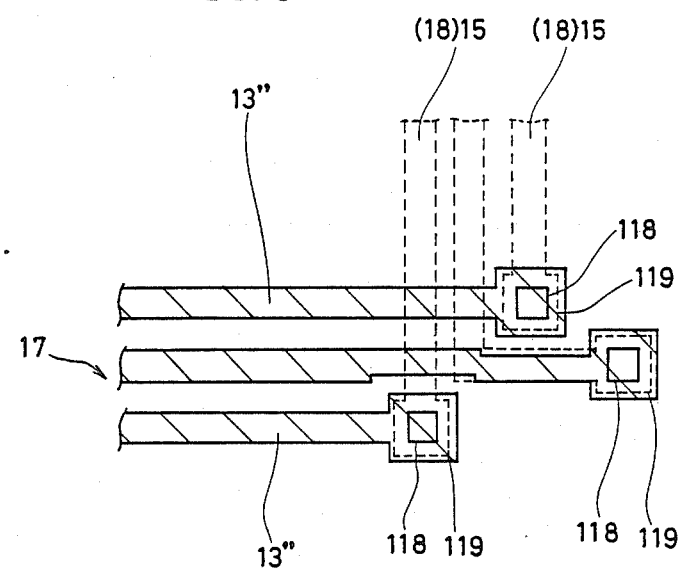
FIG. 5 is a plan view showing a preferred embodiment of through-hole connections between the connection runs of the first electrode layer in the second region and the connection runs of the second electrode layer in accordance with a preferred embodiment of the present invention.

FIG. 5 is an enlarged plan view of a portion of the second region 17 of the main surface of a semiconductor integrated circuit in another embodiment of the present invention. Briefly described, the embodiment shown in FIG. 5 comprises an improvement in formation of the through-holes between the connection runs 13" in the second portion of the first electrode layer 13 in the second region 17 and the connection runs 18 of the second electrode layer 15. In case of the embodiment shown in FIG. 3, the through-holes were formed at the intersections between the connection runs 13" of the second portion of the first electrode layer 13 in the second region 17 and the connection runs 18 of the second electrode layer 15. However, it is necessary to increase the width of the connection runs 13" of the first electrode layer 13 and the connection runs 18 of the second electrode layer 15 at the positions where through-holes are to be formed for connection through the second insulating layer 14. More specifically, in case of the connection runs 13" of the first electrode layer 13 of the width of 12.5 μm, increased width portions 119 each of a square form of 45 μm×45 μm are formed at the end of the respective connection runs 13" of the second portion of the first electrode layer 13 at the positions of the through-holes 118, whereupon the through-holes are formed in a square form of 12.5 μm×12.5 μm, and then increased width portions of a square form of 35 μm, are formed at the ends of the connection runs 18 of the second electrode layer 15 at the positions of the above described through-holes 118. As a result, in accordance with the embodiment shown in FIG. 3, it could happen that the increased width portions of the connection runs of the adjacent through-holes collide with each other. Therefore, the embodiment shown in FIG. 5 comprises an improved formation of those through-holes at the positions where such conflict does not occur.

Referring to FIG. 5, at least one of the connection runs 18 of the second electrode layer 15 is adapted to be bent at an intersecting point where the connection run 18 of the second electrode layer 15 intersects a predetermined connection run 13" of the second portion of the first electrode layer 13 to extend along the predetermined connection run 13" of the second portion of the first electrode layer 13 to a location spaced apart from the above described intersecting point and is connected through the second insulating layer 14 to the predetermined connection run 13" of the second portion of the first electrode layer 13. As a result, the above described location where the above described at least one of the connection runs 18 of the second electrode layer 15 is connected through the second insulating layer 14 to the predetermined connection run 13" of the second portion of the first electrode layer 13 is dislocated from another location of such connection between a different connection run 18 of the second electrode layer 15 and a different connection run 13" of the second portion of the first electrode layer 13 in the direction of the connection runs 13" of the second portion of the first electrode layer 13. Thus, conflict in terms of area among such connection runs between the connection runs 18 of the second electrode layer 15 and the connection runs 13" of the second portion of the first electrode layer 13 is eliminated.

Figure 8:
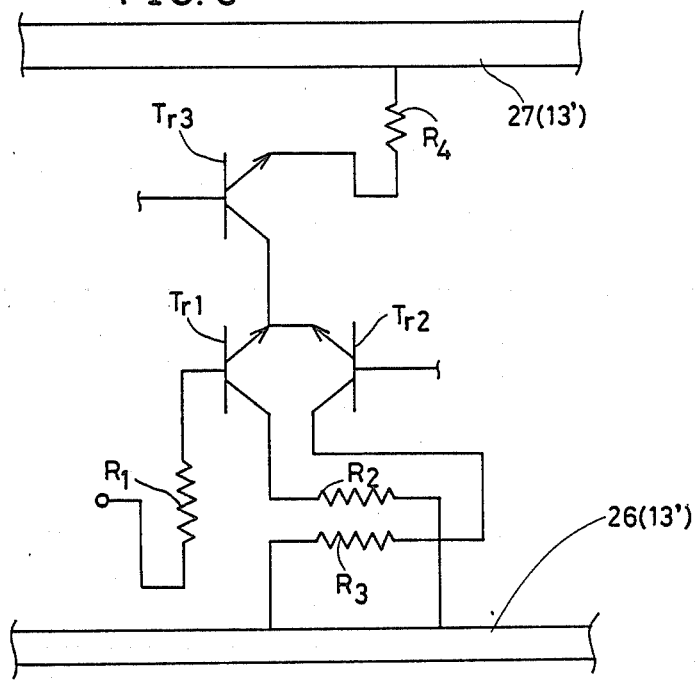
FIG. 8 is a schematic diagram showing an equivalent circuit of a portion of the integrated circuit shown in FIG. 6.
Figure 7:
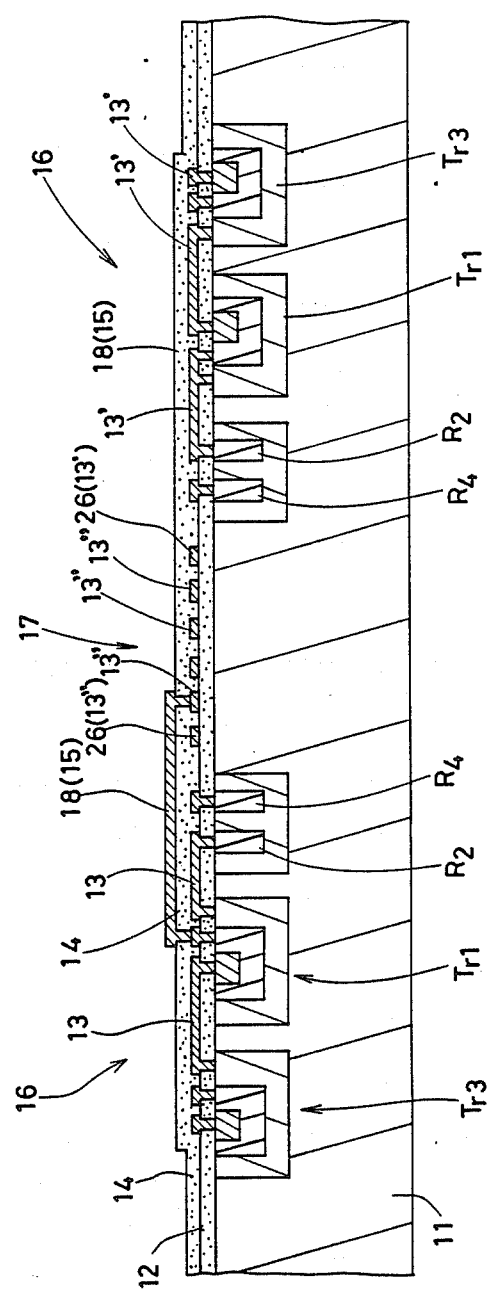
FIG. 7 is a partial sectional view of the integrated circuit shown in FIG. 6 taken along the line VII-VII in FIG. 6.

FIG. 6 is a plan view showing in more detail an example of an arrangement of the connection runs of the first and second electrode layers as well as the circuit elements, FIG. 7 is a partial sectional view of the integrated circuit shown in FIG. 6 taken along the line VII—VII in FIG. 6, and FIG. 8 is a schematic diagram showing an equivalent circuit of a portion of the integrated circuit shown in FIG. 6. It is pointed out that in these FIGS. 6 to 8 like portions are denoted by the same reference characters as those in FIGS. 3 to 5 and the circuit elements are also illustrated to show how the circuit elements are connected to the connection runs of the first and second electrode layers.

With particular reference to the upper and lower halves in FIG. 6, the same patterns for the circuit elements are shown in a symmetrical manner. The circuit elements of the patterns shown comprise transistors Tr1, Tr2, Tr3 and resistors R1, R2, R3, R4. As previously described, these circuit elements in the upper and lower halves constitute a two-channel amplifier circuit. An equivalent circuit of the amplifier in the upper half channel is shown in FIG. 7. Referring to FIG. 7, the connection runs 13' of the first portion of the first electrode layer 13 are connected to the circuit elements through the first insulating layer 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit having a multiple-layered connection, comprising:
    a semiconductor substrate having a main surface divided into first and second regions, said first region including first and second portions, said second region both including first and second sides and being rectangularly shaped;
    said first portion being formed outside of and adjacent to said first side;
    said second portion being formed outside of and adjacent to said second side,
    integrated circuit elements formed in said first and second portions of said first region,
    a first insulating layer covering said main surface of said semiconductor substrate,
    a first electrode layer formed on said first insulating layer and including connection runs,
    a first portion of said connection runs of said first electrode layer extending in said first and second portions of said first region, at least a part of said first portion of said connection runs of said first electrode layer being connected through said first insulating layer to said integrated circuit elements,
    a second portion of said connection runs of said first electrode layer extending in said second region, said second portion of said connection runs being of the number necessary for cross connections being formed concentratedly in said second region,
    a third portion of said connection runs of said first electrode layer constituting a voltage supply line and extending between said first region and said second region, such that said second portion of said connection runs in said second region is surrounded by said voltage supply line, while said voltage supply line extends to face said first and second portions of said first region of said main surface of said semiconductor substrate for connection to said integrated circuit elements, said voltage supply line being disposed in a U-shaped configuration including two parallel line elements, the distance between the said two line elements being selected such that any necessary ones of said connection runs may be formed in the whole of said second region, said line elements being electrically connected together at like first ends via a bridging element, at least one bonding pad being electrically connected to said bridging element, and said line elements being electrically isolated between like second ends;
    a second insulating layer covering said first insulating layer and said first electrode layer, and
    a second electrode layer formed on said second insulating layer and including connection runs extending between said first and second regions across and above said voltage supply line, at least a portion of said connection runs of said second electrode layer in said first regions being connected through said second insulating layer to said connection runs of said first portion of said first electrode layer in said first and second portions of said first region of said main surface of said semiconductor substrate and being connected through said second insulating layer to said connection runs of said second portion of said first electrode layer in said second region of said main surface of said semiconductor substrate;
    whereby said integrated circuit elements connected through said first portion of said connection runs of said first electrode layer to said connection runs of said second electrode layer in said first and second portions of said first region are connected to each other across and above said voltage supply line and via either said second portion of said connection runs or said first electrode layer.

2. A semiconductor integrated circuit having a multiple-layered connection in accordance with claim 1, wherein
    said first electrode layer comprises a fourth portion of said connection runs constituting a ground line.

3. A semiconductor integrated circuit having a multiple-layered connection in accordance with claim 3, wherein
said two line elements of said voltage supply line of said third portion of said connection runs (13') are adapted to extend in parallel with each other.

4. A semiconductor integrated circuit having a multiple-layered connection in accordance with claim 3, wherein
said connection runs (13") of said second portion of said first electrode layer (13) are adapted to extend in parallel with said two line elements of said third portion of said first electrode layer constituting said voltage supply line.

5. A semiconductor integrated circuit having a multiple-layered connection in accordance with claim 4, wherein
said connection runs (18) of said second electrode layer (15) are adapted to extend in the direction intersecting said connection runs (13") of said second portion of said first electrode layer (13).

6. A semiconductor integrated circuit having a multiple-layered connection in accordance with claim 5, wherein
said direction of said connection runs (18) of said second electrode layer (15) intersecting said connection run (13") of said second portion of said first electrode layer (13) is selected to be at the right angle.

7. A semiconductor integrated circuit having a multiple-layered connection in accordance with claim 1, wherein
said integrated circuit elements in said first portion of said first region constitute a first channel amplifier, and
said integrated circuit elements of said second portion of said first region constitute a second channel amplifier, whereby a two-channel amplifier circuit is constituted.

8. A semiconductor integrated circuit having a multiple-layered connection in accordance with claim 7, wherein
said integrated circuit elements (Tr1, . . . R1, . . . ) comprise bipolar transistors.

9. A semiconductor integrated circuit having a multiple-layered connection in accordance with claim 8, wherein
said two-channel amplifier circuit is configured as a balanced transformerless circuit.

10. A semiconductor integrated circuit having a multiple-layered connection in accordance with claim 5, wherein
at least one of said connection runs (18) of said second electrode layer (15) is adapted to be bent at a point where said connection run (18) crosses a predetermined connection run (13") of said second portion of said first electrode layer (13) to extend along said predetermined connection run (13") of said second portion of said first electrode layer (13) to a location spaced apart from said intersecting point and is connected through said second insulating layer (14) to said predetermined connection run (13") of said second portion of said first electrode layer (13), whereby said location where said at least one of said connection runs (18) of said second electrode layer (15) is connected through said second insulating layer (14) to said predetermined connection run (13") of said second portion of said first electrode layer (13) is dislocated in the direction of said connection runs of said second portion from another location of such connection between a different connection run (18) of said second electrode layer (15) and a different connection run (13") of said second portion of said first electrode layer (13) whereby overlapping of such connections between said connection runs (18) of said electrode layer (15) and said connection runs (13") of said second portion of said first electrode layer (13) is eliminated.

11. A semiconductor integrated circuit having a multiple-layered connection configuration, comprising:
a semiconductor substrate having a main surface with first through fourth sides;
a first insulating layer deposited on top of said main surface;
a continuous first electrode formed on said first insulating layer along the perimeter of three successive ones of said first through fourth sides, thereby forming a U-shaped electrode opening in one direction;
at least one bonding pad being provided at a predetermined location on said first electrode;
a U-shaped continuous second electrode formed on said first insulating layer in an area centrally located between two opposing parallel arms of said U-shaped first electrode, said second electrode including two opposing parallel arms interconnected at common ends by a bridging arm perpendicular thereto, the area between the latter said parallel arms and said bridging arm being rectangular in shape;
at least one bonding pad being formed on said first insulating layer and electrically connected to said bridging arm of said second electrode;
a plurality of third electrodes formed on said first insulating layer between and in parallel with opposing parallel arms of said second electrode;
a second insulating layer covering said first through third electrodes, and exposed areas of said first insulating layer;
a plurality of fourth electrodes formed on top of said second insulating layer partly over preselected portions of either one or a combination of said second and third electrodes; and
through-hole connection means for both (1) electrically connecting selected ones of said fourth electrodes to selected ones of said third electrodes, and (2) providing electrical connection from the top of said second electrode, thereby facilitating the electrical interconnection and layout of integrated circuit elements upon said substrate.

12. The semiconductor integrated circuit of claim 11, further including:
said second electrode having formed on said first insulating layer a plurality of electrode projections extending perpendicularly from each one of its arms toward opposite sides of said substrate, respectively, for facilitating via said through-hole connection means, the electrical connection of said second electrode to said integrated circuit elements.

13. The semiconductor integrated circuit of claim 11, wherein said first electrode provides electrical connections for a source of reference potential.

14. The semiconductor integrated circuit of claim 13, wherein said second electrode provides electrical connections for a source of dc voltage.

* * * * *